(12) United States Patent
Tsuji

(10) Patent No.: US 6,376,365 B1
(45) Date of Patent: Apr. 23, 2002

(54) METHOD FOR FABRICATING SEMICONDUCTOR DEVICES

(75) Inventor: Atsushi Tsuji, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/598,306

(22) Filed: Jun. 21, 2000

(30) Foreign Application Priority Data

Jun. 22, 1999 (JP) .............................................. 11-175354

(51) Int. Cl.[7] ..................... H01L 21/4763; H01L 21/311
(52) U.S. Cl. ........................ 438/637; 438/622; 438/623; 438/624; 438/700; 438/706
(58) Field of Search ................................. 438/700, 706, 438/735–738, 740, 622–624, 637–640, 672, 675, 723, 725, 702

(56) References Cited

U.S. PATENT DOCUMENTS 5,565,384 A  * 10/1996  Havemann .................. 437/228
5,598,027 A  *  1/1997  Matsura ....................... 257/635
6,171,968 B1 *  1/2001  Hsu ............................ 438/700
6,187,672 B1 *  2/2001  Zhao et al. .................. 438/639

FOREIGN PATENT DOCUMENTS

EP                  680084           *  4/1995

* cited by examiner

Primary Examiner—Charles Bowers
Assistant Examiner—Thanhha Pham
(74) Attorney, Agent, or Firm—Sonnenschein, Nath & Rosenthal

(57) ABSTRACT

A method for fabricating semiconductor devices having multi-layered wiring structure with an advanced reliability and free from shortcircuit failure between the upper and lower wirings is provided. The method has a step for forming on a first insulating film, having a conductive body exposed thereon, a second insulating film so as to cover the conductive body, and a step for forming by etching a recess to the second insulating film so as to reach the conductive body. In this case at least the lower portion of the second insulating film is formed with a material showing a faster etching rate over at least the upper portion of the first insulating film.

17 Claims, 11 Drawing Sheets

METHOD FOR FABRICATING SEMICONDUCTOR DEVICES

RELATED APPLICATION DATA

The present application claims priority to Japanese Application No. P11-175354 filed June 22, 1999 which application is incorporated herein by reference to the extent permitted by law.

BACKGROUND OF THE INVENTION

1. Field of the Invention

The present invention relates to a method for fabricating semiconductor devices and in particular to a method for fabricating semiconductor devices having misalignment of the mask in mind.

2. Description of the Related Art

As the design rule for LSIs becomes microscopic, not only microfabrication of width of gate electrodes of MOS transistors but also microfabrication of spaces between the gate electrodes to reduce the size of memory cells or so become very important. This inevitably demands the microstructure of an inter-wiring pitch of metal wirings interconnecting the MOS transistors. In the conventional devices, as shown in FIG. 6A, a contact hole 402 for interconnecting an upper wiring (not shown) and a lower wiring 401 is generally formed in a portion having so-called alignment margin 403 which is provided to the lower wiring 401 to prevent the contact hole 402 from being failed in landing. A minimum inter-wiring pitch "d" is thus limited by a space between portions having alignment margins 403, and as a result, an inter-wiring pitch "pn" between portions having no alignment margin has to be wider than the minimum inter-wiring pitch "d" just by such margins.

In recent LSIs, it, however, becomes tight to provide such alignment margin to the lower wiring as the design rule becomes microscopic. Thus, as shown in FIG. 6B, a wiring structure in which a contact hole 412 is formed on a lower wiring 411 while scarcely reserving an alignment margin 413 is proposed.

Next, a conventional method for fabricating a multi-layered wiring for a semiconductor device will be described referring to FIGS. 7A to 7H. Assuming that devices such as MOS transistors, resistors, capacitors or the like are already fabricated, the description will start from a step for forming the first metal wiring in the multi-layered wiring process.

As shown in FIG. 7A, after fabricating MOS transistors and other devices in the lowermost layer of a silicon substrate (not shown), an interlayer insulating film 101 made of silicon oxide is formed by, for example, CVD (chemical vapor deposition) process, and the surface of which is then made flat by reflow, etchback or CMP (chemical mechanical polishing) process. A contact hole (not shown) used for making contact with the silicon substrate (not shown) is then formed in the interlayer insulating film 101. On such interlayer insulating film 101, a first conductive film (e.g., aluminum film) 121 is then formed typically in a thickness of about 500 nm. Further thereon, an insulating film 122 of a silicon oxide-base is formed typically in a thickness of about 150 nm by, for example, CVD process.

A resist mask (not shown) used for forming first wirings is then formed on the insulating film 122 by the general procedures of resist coating and lithography. The insulating film 122 and the first conductive film 121 are then etched using the resist mask as an etching mask, thereby to obtain the first wirings 102 comprising the patterned first conductive film 121 and insulating film 122 stacked thereon, as shown in FIG. 7B.

Next, as shown in FIG. 7C, an interlayer insulating film 103 made of silicon oxide is formed on the interlayer insulating film 101 so as to cover the first wirings 102 by CVD process. Using a high-density plasma CVD process in the film forming will result in an excellent inter-wiring deposition property of the interlayer insulating film 103. The surface of the interlayer insulating film 103 is then polished by, for example, CMP process, thereby to make the surface of which flat as shown in FIG. 7D.

With reference now to FIG. 7E, a resist mask (not shown) used for forming contact holes 104 to be connected to the predetermined first wirings 102 is formed on the interlayer insulating film 103. Using such resist mask as an etching mask, the interlayer insulating film 103 and the insulating film 122 are etched to form the contact holes 104 which reach to the first wirings 102. Since the interlayer insulating film 103 may in some cases have global level difference or non-uniform thickness lot by lot or wafer by wafer, over-etching is performed in the above etching so as to ensure that all of the contact holes 104 can reach the first wiring 102.

Next, as shown in FIG. 7F, a barrier metal layer (not shown) typically comprising a titanium film and a titanium nitride film stacked thereon is formed on the inner surface of the contact holes 104. The barrier metal layer ensures adhesiveness to the first wirings 102 and suppresses resistivity. A tungsten film is then formed by the CVD process so as to fill the contact holes 104. Excessive portions of the tungsten film and the barrier metal layer spreading over the top surface of the interlayer insulating film 103 are then removed by the etchback process or CMP, thereby to leave, as plugs 105, the tungsten film and barrier metal layer only in the contact holes 104.

Next, as shown in FIG. 7G, a second conductive film (for example, an aluminum film) 124 is formed typically in a thickness of 500 nm on the interlayer insulating film 103 so as to cover the plugs 105. A silicon oxide-base insulating film 125 is further formed thereon in a thickness of, for example, 150 nm.

A resist mask (not shown) used for forming second wirings is formed on the insulating film 125 by the general procedures of resist coating and lithography. The insulating film 125 and the second conductive film 124 are then etched using the resist mask as an etching mask, thereby to obtain the second wirings 106 comprising the patterned second conductive film 124 and insulating film 125 stacked thereon, and contacting the plugs 105.

Further stacking of upper wirings can be achieved by repeating the foregoing fabrication processes of the interlayer insulating film, contact holes, plugs and wirings explained referring to FIGS. 7C to 7H.

In such process, providing a reduced or no alignment margin will, however, raises problems described hereafter. Such problems will be explained referring to FIG. 8 which shows an exemplary structure having no alignment margin. FIG. 8 shows a multi-layered wiring structure having three layers of wiring fabricated as explained above in the Related Art. In this figure, device structures such as MOS transistors, resistors and capacitors fabricated in a layer lower than the multi-layered wiring structure are not shown for simplicity, whereas only the multi-layered wiring structure is shown.

As shown in FIG. 8, the first wirings 102 are formed on the interlayer insulating film 101. Thus formed first wirings 102 are capped with the silicon oxide-base insulating film 122, and further the interlayer insulating film 103 is formed so as to cover the silicon oxide-base insulating film 122. The interlayer insulating film 103 has, as formed therein, the contact holes 104 which reach to the first wirings 102, and the plugs 105 are formed in the contact holes 104. On the interlayer insulating film 103, the second wirings 106 are formed as capped with the silicon oxide-base insulating film 125, and some of the second wirings 106 are connected to the plugs 105.

On the interlayer insulating film 103, the interlayer insulating film 107 is further formed so as to cover the second wirings 106. The interlayer insulating film 107 has, as formed therein, contact holes 108 which reach the second wirings 106, and the plugs 109 are formed in the contact holes 108. On the interlayer insulating film 107, third wirings 110 are formed as capped with the silicon oxide-base insulating film 126, which are connected to the plugs 109.

If misalignment of a photomask in an exposure step for forming the contact holes 108 should occur in a process for fabricating such multi-layered wiring structure, the contact holes 108 will fail in correctly landing on the second wirings 106. Making matters worse, the second wirings 106 have no alignment margin, and the whole portion of interlayer insulating films 107, 103 are made of a silicon oxide-base material only, so that the etching for fabricating contact holes 108 tends to proceed excessively in the area not overlapped with the second wirings, and in the worst case, the contact holes 108 are formed so as to even reach the first wirings 103 as shown in the figure. If the plugs 109 are formed in such-fabricated contact holes 108, not only the third wirings 110 and second wirings 106, but also the first wirings 103 provided in the lower layer are connected each other via the plugs 109, which results in short circuit. This significantly ruins reliability of the wirings.

SUMMARY OF THE INVENTION

To solve the foregoing problem, it is therefore an object of the present invention to provide a method for fabricating semiconductor devices comprising a step for forming on a first insulating film, having a conductive body exposed thereon, a second insulating film so as to cover the conductive body, and a step for forming by etching a recess to the second insulating film so as to reach the conductive body, is characterized in that at least the lower portion of the second insulating film is formed with a material showing a faster etching rate over at least the upper portion of the first insulating film.

According to such method for fabricating semiconductor devices, at least the lower portion of the second insulating film is formed with a material showing a faster etching rate over at least the upper portion of the first insulating film, so that the etching of the second insulating film, such that for fabricating the recess so as to reach the first conductive body, will stop with certainty on the first insulating film. At least the etching should not proceed so as to penetrate the first insulating film. Thus the recess should not be formed so as to penetrate the first insulating film due to over-etching, even when misalignment of a photomask should occur and the recess cannot be formed in a predetermined position, or more specifically, even when the recess should be formed so as to be partially shifted from the position of the conductive body. Thus the recess will have its bottom on the surface of the first insulating film, or at most within the upper portion of the first insulating film. Thus the multi-layered wiring with an advanced reliability can be obtained without causing short circuit between the upper and lower wirings, which results in improved reliability of semiconductor devices.

DESCRIPTION OF THE PREFERRED EMBODIMENTS

Example 1

Figure 1A:
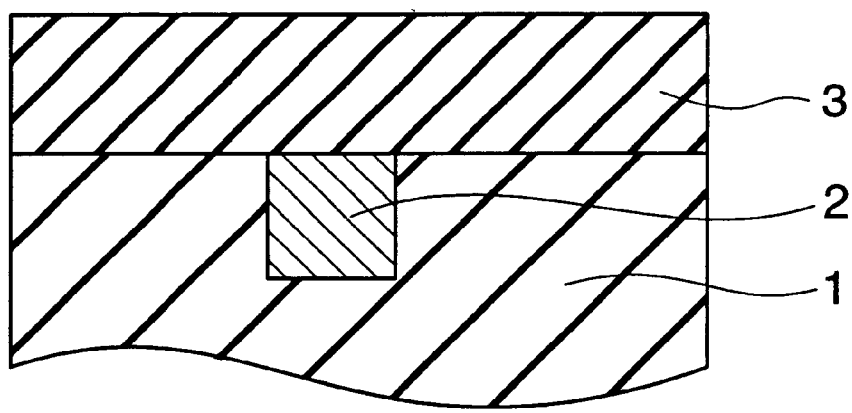
FIGS. 1A and 1B are process diagrams for explaining Example 1 of the present invention.
Figure 1B:
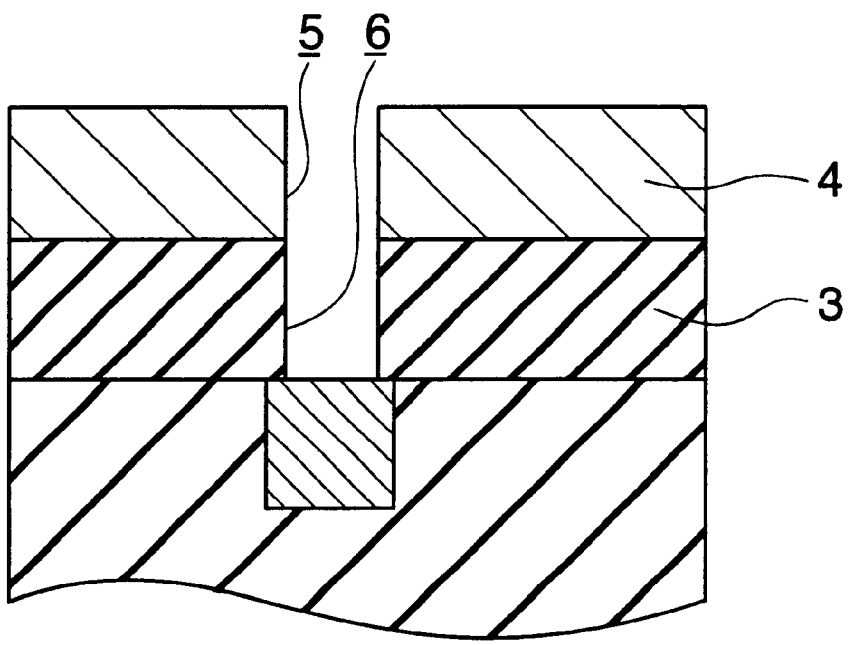

Example 1 of the present invention will be explained referring to process diagrams as shown in FIGS. 1A and 1B.

As shown in FIG. 1A, a conductive body 2 is embedded in a first insulating film 1 so as to expose the surface thereof to the same plane with the first insulating film 1. The conductive body 2 comprises groove wirings and/or plugs. The groove wirings are illustrated in the drawings. On the thus-composed first insulating film 1, a second insulating film 3 is formed by, for example, CVD process so as to cover the conductive body 2.

The first insulating film 1 and the second insulating film 3 are formed to satisfy a condition such that at least the lower portion of the second insulating film 3 is formed with a material showing a faster etching rate over at least the upper portion of the first insulating film 1, and more specifically such that, in the process of etching at least the lower portion of the second insulating film 3, at least the upper portion of the first insulating film 1 cannot be etched at all, or can be etched only at an etching rate affording an etching depth not exceeding the thickness of the conductive body 2 at most, even when the second insulating film 3 is over-etched by approx. 30%. Of course, the whole portion of the first insulating film 1 and second insulating film 3 may individually be made of an uniform material. For example, the first insulating film 1 and second insulating film 3 are formed so as to ensure an etching selectivity of the second insulating film 3 over the first insulating film 1 of 3 or above, and more preferably 5 or above.

Next, as shown in FIG. 1B, a resist film 4 is formed on the second insulating film 3 using a general resist coating technique, and an opening 5, through which a recess 6 will be processed later, is then formed to the resist film 4 by a lithographic technique. Next, the second insulating film 3 is etched using the patterned resist film 4 as an etching mask to form a recess 6 so as to reach the conductive body 2. The recess 6 comprises any one of a contact hole, groove, or a combination of a groove and a contact hole connected to the bottom thereof, which is illustrated as a contact hole in the drawing. The recess 6 can be formed using known technologies for lithography and etching. Thereafter the resist film 4 is removed.

In the following paragraphs, cases 1 to 4 as exemplary combinations of the materials for the first insulating film 1 and the second insulating film 3 will be described, where the materials are combined so that at least the lower portion of the second insulating film 3 can have a faster etching rate over at least the upper portion of the first insulating film 1, and more specifically, so as to ensure that an etching selectivity of at least the lower portion of the second insulating film 3 over at least the upper portion of the first insulating film 1 is 3 or above, and more preferably 5 or above.

[Case 1]

The first insulating film 1 is formed with an inorganic insulating film, and the second insulating film 3 is formed with an organic insulating film, where an etching selectivity of the organic insulating film over the inorganic insulating film being selected as 3 or above, and more preferably 5 or above. For example, the first insulating film 1 can be formed using an inorganic film made of silicon-base xerogel such as porous silica; fluorine-containing silicon oxide; silicon oxide; silicon oxycarbide (SiOC) such as Black Diamond (product name); silicon nitride, or the like; whereas the second insulating film 3 can be formed using an organic film made of polyaryl ether [for example, FLARE (product name) by AlliedSignal Inc., SiLK (product name) by Dow Chemical Company and VELOX (product name) by Shoemacker Inc.]; polyimide; BCB benzocyclobutene); fluorocarbon resin [for example, cyclic fluorocarbon resin, polytetrafluoroehylene (PTFE) and amorphous PTFE such as Teflon AF (product name) by DuPont ]; fluorinated polyaryl ether; fluorinated polyimide, or the like.

The etching selectivity as described above can successfully be achieved by using xerogel for the first insulating film 1, using fluorinated polyaryl ether, a kind of fluorocarbon resin, for the second insulating film 3, and etching the second insulating film 3 using a mixed gas of hexafluoroethane ($C_2F_6$), carbon monoxide (CO) and argon (Ar) as an etching gas in a general type of plasma etching apparatus.

[Case 2]

The first insulating film 1 is formed with a first organic insulating film, and the second insulating film 3 is formed with a second organic insulating film, where an etching selectivity of the second organic insulating film over the first organic insulating film being selected as 3 or above, and more preferably 5 or above. For example, the first insulating film 1 can be formed using a fluorine-free organic film made of polyaryl ether or polyimide; whereas the second insulating film 3 can be formed using a fluorine-containing organic film made of florocarbon resin.

The etching selectivity as described above can successfully be achieved by using polyaryl ether for the first insulating film 1, using fluorinated polyaryl ether, a kind of fluorocarbon resin, for the second insulating film 3, and etching the second insulating film 3 using a mixed gas of hexafluoroethane ($C_2F_6$), carbon monoxide (CO) and argon (Ar) as an etching gas in a general type of plasma etching apparatus.

[Case 3]

The first insulating film 1 is formed with an organic insulating film, and the second insulating film 3 is formed with an inorganic insulating film, where an etching selectivity of the inorganic insulating film over the organic insulating film being selected as 3 or above, and more preferably 5 or above. For example, the first insulating film 1 can be formed using an organic film made of polyaryl ether [for example, FLARE (product name) by Allied Signal Inc., SiLK (product name) by Dow Chemical Company and VELOX (product name) by Shoemacker Inc.]; polyimide; BCB (benzocyclobutene); fluorocarbon resin [for example, cyclic fluorocarbon resin, polytetrafluoroehylene (PTFE) and amorphous PTFE such as Teflon AF (product name) by DuPont]; fluorinated polyaryl ether; fluorinated polyimide, or the like; whereas the second insulating film 3 can be formed using an inorganic film made of silicon-base xerogel such as porous silica; fluorine-containing silicon oxide; silicon oxide; silicon oxycarbide (SiOC) such as Black Diamond; silicon nitride, or the like; whereas the second insulating film 3 can be formed.

The etching selectivity as described above can successfully be achieved by using polyaryl ether for the first insulating film 1, using fluorocarbon resin, a kind of fluorocarbon resin, for the second insulating film 3, and etching the second insulating film 3 using a mixed gas of octafluorobutene ($C_4F_8$), carbon monoxide (CO) and argon (Ar) as an etching gas in a general type of plasma etching apparatus.

[Case 4]

The first insulating film 1 is formed with a first inorganic insulating film, and the second insulating film 3 is formed with a second inorganic insulating film, where an etching selectivity of the second inorganic insulating film over the first inorganic insulating film being selected as 3 or above, and more preferably 5 or above. For example, the first insulating film 1 can be formed using fluorine-containing silicon oxide; silicon oxide; silicon oxycarbide (SiOC) such as Black Diamond; silicon nitride, or the like; whereas the second insulating film 3 can be formed using an inorganic film made of a material different from that forming the first insulating film and selected from silicon-base xerogel such as porous silica; fluorine-containing silicon oxide film; silicon oxide; silicon oxycarbide (SiOC) such as Black Diamond, or the like.

The etching selectivity as described above can successfully be achieved by using silicon nitride for the first insulating film 1, using silicon oxide for the second insulating film 3, and etching the second insulating film 3 using a mixed gas of octafluorobutene ($C_4F_8$), carbon monoxide (CO) and argon (Ar) as an etching gas in a general type of plasma etching apparatus.

Figure 2:
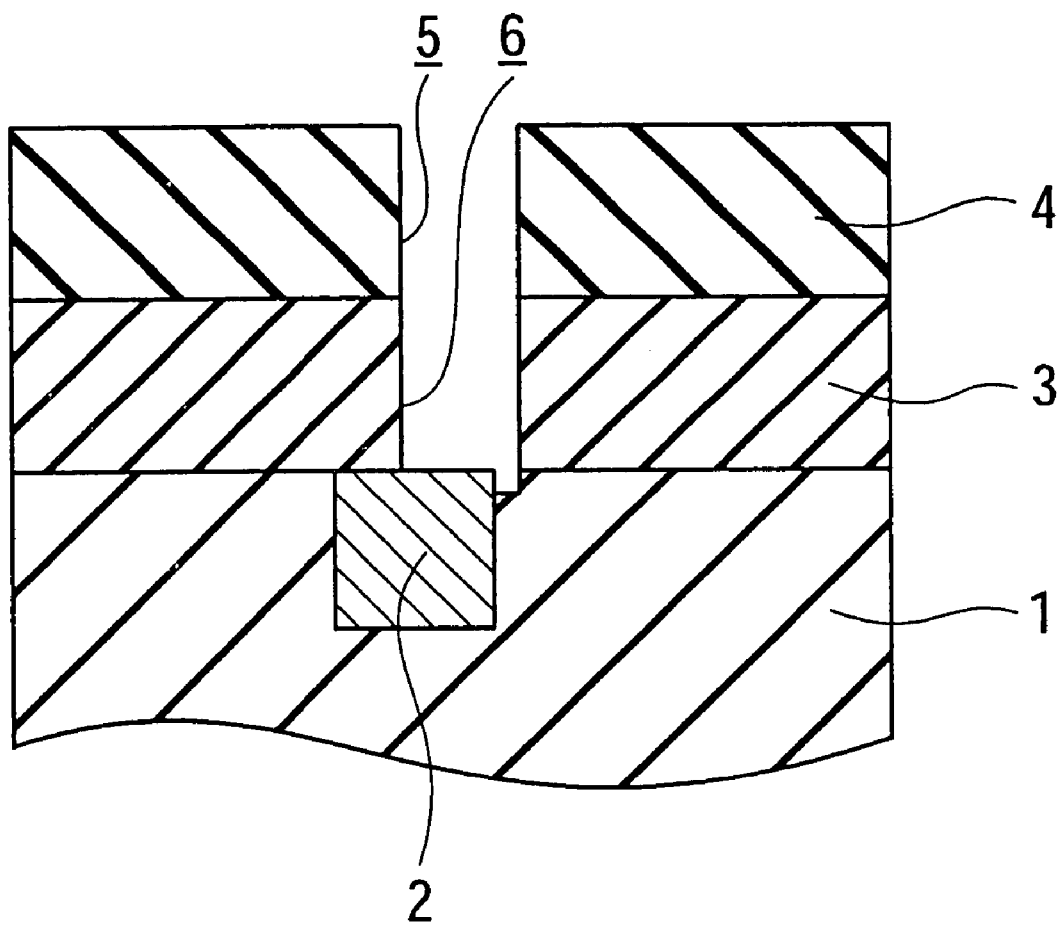
FIG. 2 is a schematic sectional view for explaining the operation and effect of Example 1.

According to Example 1, even if misalignment of a photomask should occur and thus the opening 5 of the resist film 4 is formed so as to be partially shifted from a predetermined position in a pattern layout, more specifically, from the position of the conductive body 2, the etching for fabricating the recess 6 to the second insulating film 3 using such resist film 4 as an etching mask will never proceed excessively as shown in FIG. 2. That is, the over-etching can proceed along one side-wall of the conductive body 2 but will stop at most at a level slightly deeper than the surface of the first insulating film 1, since the first insulating film 1 is made of a material exhibiting an etching rate slower than that for the second insulating film 3. So that the recess 6 is prevented from being formed so as to penetrate the first insulating film 1 aside the conductive body 2.

Example 2

Figure 3A:
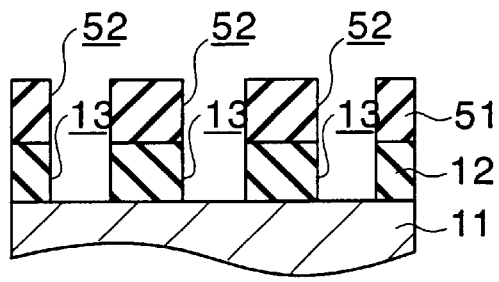
FIGS. 3A to 3H are process diagrams for explaining Example 2 of the present invention.
Figure 3B:
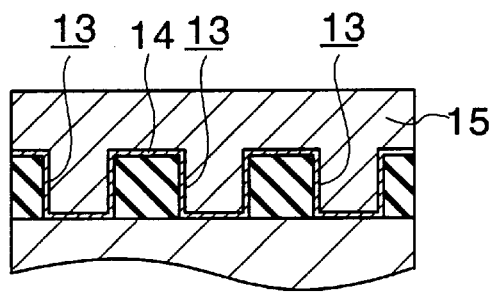
Figure 3C:
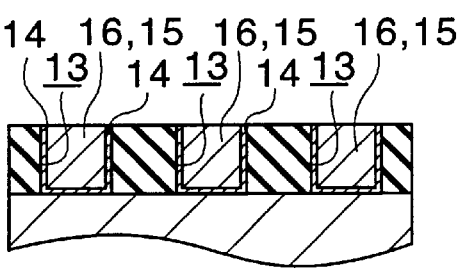
Figure 3D:
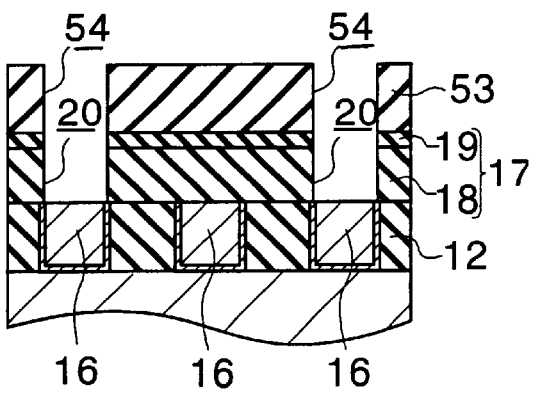
Figure 3E:
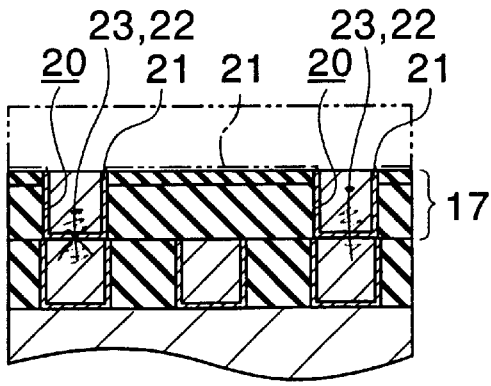
Figure 3F:
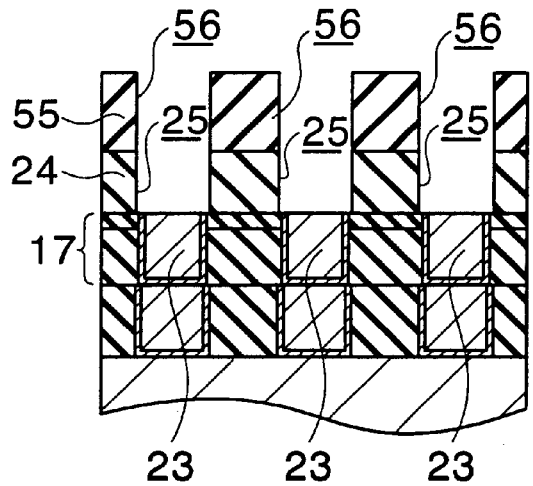
Figure 3G:
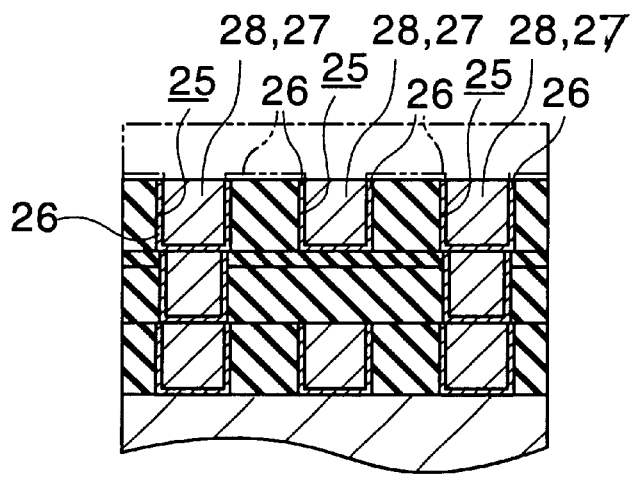
Figure 3H:
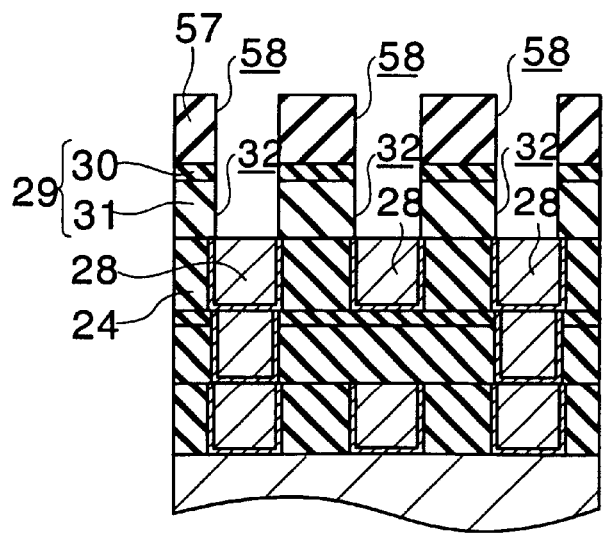

Next, Example 2 of the present invention will be explained referring to process diagrams as shown in FIGS. 3A and 3H.

As shown in FIG. 3A, a first insulating film 12 is formed on a substrate 11, on the upper plane of which an interlayer insulating film (not shown) having already been formed. The first insulating film 12 is formed using, for example, xerogel (e.g., porous silica), a kind of inorganic material. The xerogel may be of any type provided that it is produced by coating a silanol resin having an aromatic alkyl group of a relatively large carbon number, gellating the coated film, and then converting it to attain hydrophobicity by a treatment with a silane coupling agent or by hydrogenation. Next, a resist film 51 is formed on the first insulating film 12 using a general resist coating technique, and openings 52, through which wiring grooves will be processed later, are then formed to the resist film 51 by a lithographic technique. Next, the first insulating film 12 is etched using the patterned resist film 51 as an etching mask, thereby to form first wiring grooves 13.

Next, as shown in FIG. 3B, a barrier metal layer 14 typically comprising a tantalum nitride film is formed on the inner surface of the first wiring grooves 13 after removing the resist film 51, and a wiring material film 15 is then formed as embedded into the first wiring grooves 13. The wiring material film 15 can typically be formed by producing a seed layer of copper or copper alloy by sputtering process, and then depositing thereon copper or copper alloy by electrolytic plating process.

Thereafter, the excessive portions of the barrier layer 14 and wiring material film 15 spreading over the top surface of the first insulating film 12 are then removed by CMP, thereby to form, as shown in FIG. 3C, first conductive bodies (first wirings) 16 comprising the barrier layer 14 and wiring material film 15 left in the first wiring grooves 13.

Next, as shown in FIG. 3D, a second insulating film 17 is formed on the first insulating film 12 so as to cover the first wirings 16. The lower portion of the second insulating film 17 comprises a polyaryl ether film 18, having an exemplary thickness of 450 nm, for ensuring a high etching selectivity over the first insulating film 12, and the upper portion of which comprises a silicon oxide film 19 having an exemplary thickness of 50 nm and functioning as a hard mask. Next, a resist film 53 is formed thereon using a general resist coating technique, and openings 54, through which first contact holes as the recesses will be processed later, are then formed in the predetermined positions of the resist film 53 by a lithographic technique.

Next, the silicon oxide film 19 of the second insulating film 17 is etched using the patterned resist film 53 as an etching mask, and the polyaryl ether film 18 is successively etched using the patterned silicon oxide film 19, thereby to form first contact holes 20 reaching the first wirings 16. Since the resist film 53 has an etching property similar to that of the polyaryl ether film 18, the resist film 53 will be removed in the process of etching the polyaryl ether film 18.

An exemplary condition for etching the silicon oxide film 19 is such that using a general type of plasma etching apparatus, using a mixed etching gas comprising octafluorobutene ($C_4F_8$), argon (Ar) and carbon monoxide (CO), a pressure of the etching atmosphere of 6 Pa, and an RF power of 1.5 kW (13.56 MHz). An exemplary condition for etching the polyaryl ether film 18 is such that using a general ECR (Electron Cyclotron Resonance) plasma etching apparatus, using a mixed etching gas comprising nitrogen ($N_2$) and helium (He), a pressure of the etching atmosphere of 1 Pa, a microwave power of 1.0 kW and a bias RF power of 300 W (13.56 MHz).

Next, as shown in FIG. 3E, an adhesive layer 21 typically comprising a titanium nitride film is formed on the inner surface of the first contact holes 20 and on the top surface of the second insulating film 17. And further formed thereon by CVD is a plug material film 22 typically comprising a tungsten film. The excessive portions of the plug material film 22 and adhesive layer 21 (expressed with a two-dot chain lines in the drawing) spreading over the top surface of the second insulating film 17 are then removed by the etchback process or CMP, thereby to form plugs 23 comprising the adhesive layer 21 and plug material film 22 left in the first contact holes 20. FIG. 3E shows a state in which the excessive plug material film 22 and adhesive layer 21 have already been removed.

Next, as shown in FIG. 3F, a third insulating film 24 is formed on the second insulating film 17 so as to cover the plugs 23. The third insulating film 24 can be formed, for example, with silicon-base xerogel, a kind of an inorganic material. Next, a resist film 55 is formed thereon by a general resist coating technique, and openings 56, through which wiring grooves will be processed later, are then formed in the resist film 55 by a lithographic technique. The third insulating film 24 is then etched using the patterned resist film 55 as an etching mask, thereby to form second wiring grooves 25.

An exemplary condition for the etching is such that using a general type of plasma etching apparatus, using a mixed etching gas comprising octafluorobutene ($C_4F_8$), argon (Ar) and carbon monoxide (CO), a pressure of the etching atmosphere of 6 Pa, and an RF power of 1.5 kW 13.56 MHz). In this etching, the etching will stop upon exposure of the polyaryl ether film 18 even if removal of the silicon oxide film 19 thereon should occur.

Next, as shown in FIG. 3G, a barrier layer 26 typically comprising a tantalum nitride film is formed on the inner surface of the second wiring grooves 25, and a wiring material film 27 is then formed so as to fill the second wiring grooves 25. The wiring material film 27 can typically be formed by producing a seed layer of copper or copper alloy by sputtering process, and then depositing thereon copper or copper alloy by electrolytic plating process. The excessive portions of the wiring material film 27 and barrier layer 26 (expressed with two-dot chain lines in the drawing) spreading over the top surface of the second insulating film 24 are then polished off by CMP, thereby to form, in the second wiring grooves 25, second conductive bodies (second wirings) 28 comprising the wiring material film 27 and the barrier layer 26 provided thereunder.

Referring now to FIG. 3H, a fourth insulating film 29 is formed on the third insulating film 24 so as to cover the second wirings 28. The lower portion of the fourth insulating film 29 comprises a polyaryl ether film 30, having an exemplary thickness of 450 nm, for ensuring a higher etching selectivity over the third insulating film 24, and the upper portion of which comprises a silicon oxide film 31 having an exemplary thickness of 50 nm and functioning as a hard mask. Next, a resist film 57 is formed thereon using a general resist coating technique, and openings 58, through which second contact holes as the recesses will be processed later, are then formed in the resist film 57 by a lithographic technique.

The silicon oxide film 30 of the fourth insulating film 29 is then etched using the patterned resist film 57 as an etching mask, and the polyaryl ether film 31 is successively etched using the patterned silicon oxide film 30 as an etching mask, thereby to form second contact holes 32 which reach the second wirings 28. Since the resist film 57 has an etching property similar to that of the polyaryl ether film 30, the resist film 57 will be removed in the process of etching the polyaryl ether film 30. Etching conditions for the silicon oxide film 31 and polyaryl ether film 30 are the same with those described referring to FIG. 3D.

According to the method of Example 2, the etching of the second insulating film 17 for fabricating the first contact holes 20 therein so as to reach the first wirings 16 will successfully stop on the surface of the first insulating film 12, since the first insulating film 12 is formed with silicon-base xerogel (for example, porous silica), which is an inorganic material exhibiting an etching rate slower than that for at least the lower portion of the second insulating film 17, or more specifically the polyaryl ether film 18. At most, the etching will never proceed so as to penetrate the first insulating film 12. Therefore, even if misalignment of a photomask should occur and thus the first contact holes 20 are formed so as to be partially shifted from a predetermined position, or more specifically, a portion of the first contact holes 20 being partially shifted out from the first wirings 16, the etching for fabricating the first contact holes 20 will never proceed excessively during the over-etching, and thus the first contact holes 20 will have their bottoms on the surface of the first insulating film 12, or at most within a range of the thickness of the first insulating film 12.

Similarly, the etching of the fourth insulating film 29 for fabricating the second contact holes 32 therein so as to reach the second wirings 28 will successfully stop on the surface of the third insulating film 24, since the third insulating film 24 is formed with silicon-base xerogel (for example, porous silica), which is an inorganic material exhibiting an etching rate slower than that for at least the lower portion of the fourth insulating film 29, or more specifically the polyaryl ether film 30. At most, the etching will never proceed so as to penetrate the third insulating film 24.

Figure 4A:
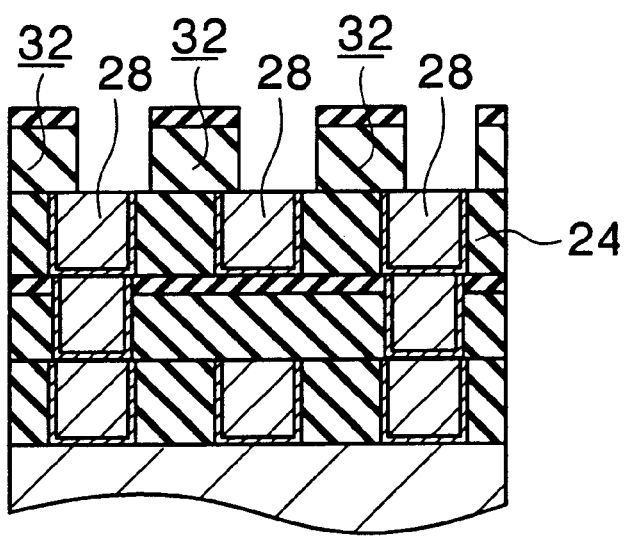
FIGS. 4A and 4B are schematic sectional views for explaining the operation and effect of Example 2.

Therefore, as shown in FIG. 4A, even if misalignment of a photomask should occur and thus the second contact holes 32 are formed so as to be partially shifted from a predetermined position, or more specifically, a portion of the second contact holes 32 being partially shifted out from the second wirings 28, the etching for fabricating the second contact holes 32 will never proceed excessively during the over-etching, and thus the second contact holes 32 will have their bottoms on the surface of the third insulating film 24, or at most within a range of the thickness of the third insulating film 24.

Figure 4B:
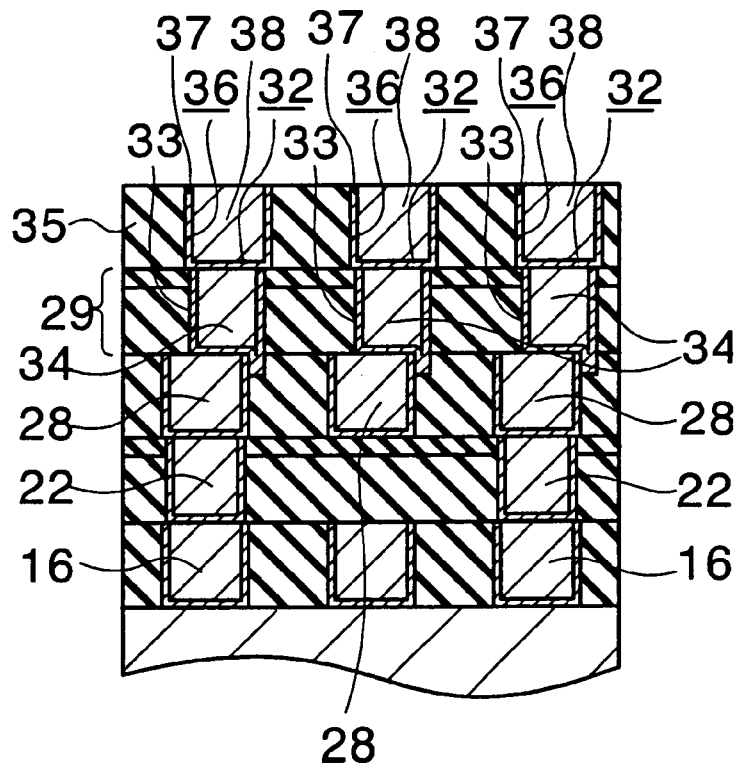

In such state, as shown in FIG. 4B, plugs 34 are formed so as to be underlain with an adhesive layer 33 in the second contact holes 32 similarly as described above in relation to FIG. 3E. A fifth insulating film 34 is then formed on the fourth insulating film 29 so as to cover the plugs 34, using silicon-base xerogel, a kind of inorganic material. Third wiring grooves 36 are then formed as described above in relation to FIG. 3G to the fifth insulating film 35. Further third conductive bodies (third wirings) 38 as underlain with a barrier layer 37 is formed in the third wiring grooves 36.

The second wirings 28 are, therefore, connected only to the first wirings 16 via plugs 22, and the third wirings 38 are connected only to the second wirings 28 via plugs 36.

The first insulating film 12, second insulating film 17, third insulating film 24 and fourth insulating film 29 explained in Example 2 may also be formed according to a combination of an organic film and an inorganic film as described in Example 1.

Example 3

Next, Example 3 of the present invention will be explained referring to process diagrams as shown in FIGS. 5A to 5F. A method described hereinafter relates to a structure in which the individual insulating films have a double-layered structure.

Figure 5A:
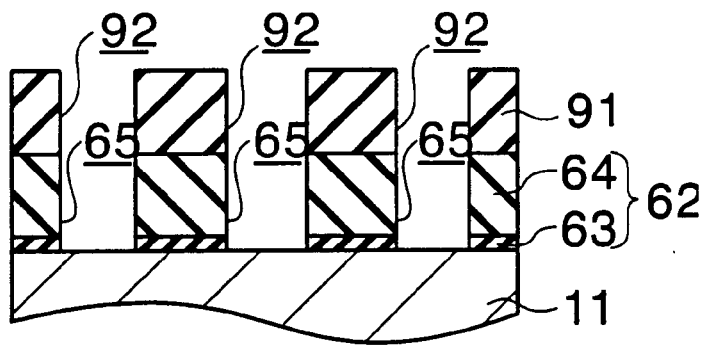
FIGS. 5A to 5F are process diagrams for explaining Example 3 of the present invention.

As shown in FIG. 5A, a first insulating film 62 is formed on the substrate 11, on the upper surface of which an interlayer insulating film (not shown) having already been formed. The first insulating film 62 typically comprises inorganic materials, and is obtained by forming a silicon nitride film 63 as the lower portion thereof, and then forming thereon a silicon oxide film 64. Next, a resist film 91 is formed on the first insulating film 62 using a general resist coating technique, and openings 92, through which wiring grooves will be processed later, are then formed to the resist film 91 by a lithographic technique. Next, the silicon oxide film 64 is etched using the patterned resist film 91 as an etching mask. The etching is performed so as to stop on the surface of the silicon nitride film 63. The silicon nitride film 63 is then etched, thereby to form wiring grooves 65 to the first insulating film 62.

Figure 5B:
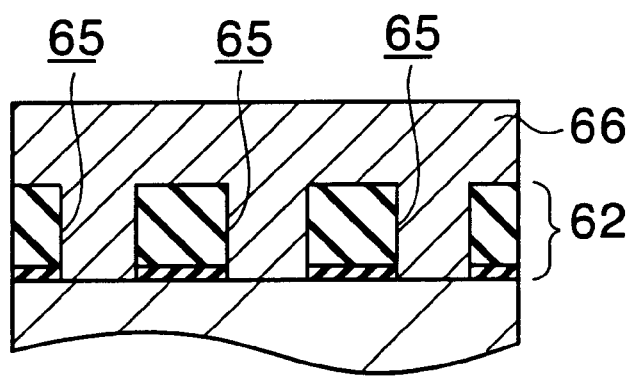
Figure 5C:
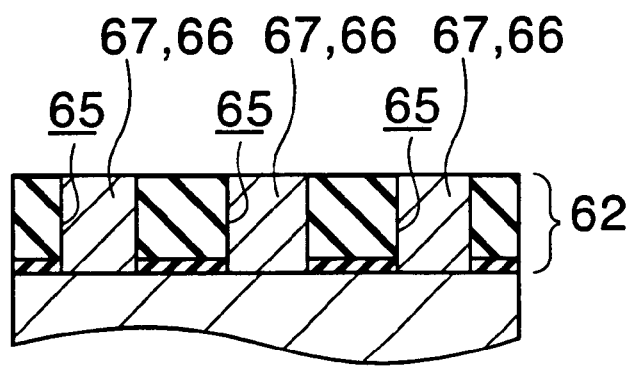

Referring now to FIG. 5B, a wiring material film 66 comprising, for example, an aluminum-copper alloy is then formed typically by sputtering on the first insulating film 62 so as to fill the first wiring grooves 65. An adhesive layer (not shown) typically made of titanium nitride may be formed as required prior to filling the aluminum-copper alloy. For the case of forming the wiring material film 66 with copper of copper alloy, a barrier layer (not shown) typically made of tantalum nitride is formed on the inner surface of the first wiring grooves 65. Excessive portion of the tungsten film spreading over the top surface of the first wiring material film 66 is then removed by CMP, thereby to leave first wirings 67 comprising the wiring material film 66 in the first wiring grooves 65, as shown in FIG. 5C.

Figure 5D:
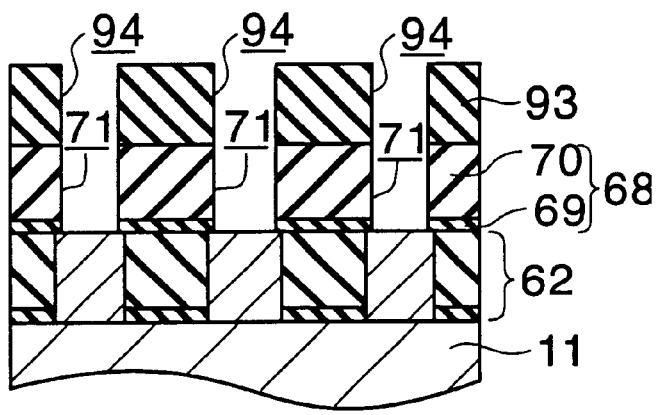

Next, as shown in FIG. 5D, a second insulating film 68 is formed on the first insulating film 62 so as to cover the first wirings 67. The second insulating film 68 comprises a silicon nitride film 69 composing the lower portion thereof, and a silicon oxide film 70 composing the upper portion thereof. Next, a resist film 93 is formed on the second insulating film 68 using a general resist coating technique, and openings 94, through which recesses, or more specifically, first contact holes will be processed later, are then formed in a predetermined position of the resist film 91 by a lithographic technique.

Next, the silicon oxide film 70 of the second insulating film 68 is then etched using the patterned resist film 93 as an etching mask, and the silicon nitride film 69 is then etched, thereby to form first contact holes 71 which reaches the first wirings 67.

Figure 5E:
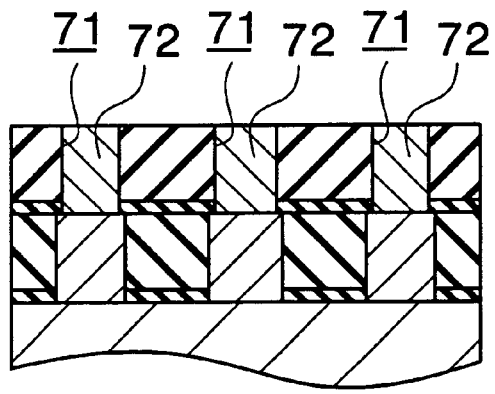

Next, as shown in FIG. 5E, an adhesive layer (not shown) typically comprising a titanium nitride film is formed on the inner surface of the first contact holes 71 and on the upper surface of the second insulating film 68. And further formed thereon is a plug material film typically comprising a tungsten film by CVD. The excessive portions of the plug material film and adhesive layer spreading over the top surface of the second insulating film 68 are then removed by the etchback process or CMP, thereby to form plugs 72 comprising the plug material film and the adhesive layer thereunder in the first contact holes 71.

Figure 5F:
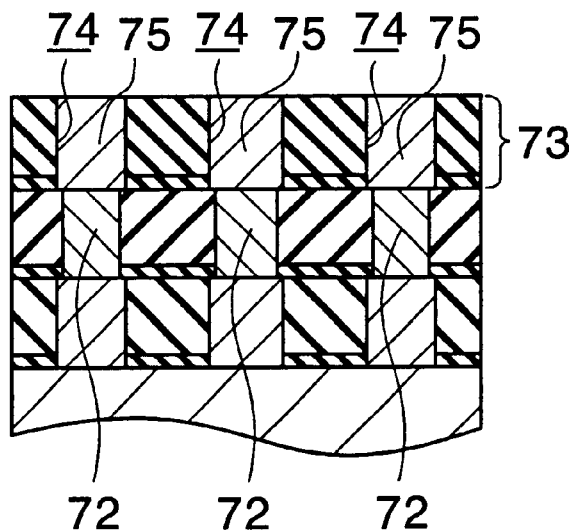

Next, as shown in FIG. 5F, a third insulating film 73 is formed on the second insulating film 68 so as to cover the plugs 72, where the third insulating film 73 can be formed by similarly repeating the processes from the formation of the first insulating film 62, involving the formation of silicon nitride film 63 and silicon oxide film 64, to the formation of the first wirings 67. This is further followed by formation of second wiring grooves 74 to the third insulating film 73, and fabrication of second wirings 75 underlain with an adhesive layer (not shown) in the second wiring grooves 74.

While not shown in the figure, it is also allowable to further repeat the plug fabrication process as shown in FIGS. 5D and 5E, and wiring fabrication process similarly, thereby to achieve a multi-layered wiring structure.

According to the method of Example 3, the etching of the second insulating film 68 for fabricating the first contact holes 71 therein so as to reach the first wirings 65 will successfully stop on the surface of the first insulating film 62, since at least the upper portion of the first insulating film 62 is formed with the silicon oxide film 64 exhibiting an etching rate slower than that for at least the lower portion of the second insulating film 68, or more specifically the silicon nitride film 69. At most, the etching will never proceed so as to penetrate the first insulating film 62.

Therefore, even if misalignment of a photomask should occur and thus the first contact holes 71 are formed so as to be partially shifted from a predetermined position, or more specifically, a portion of the first contact holes 71 being partially shifted out from the first wirings 65, the etching for fabricating the first contact holes 71 will never proceed excessively during the over-etching, and thus the first contact holes 71 will have their bottoms on the surface of the first insulating film 62, or at most within a range of the thickness of the first insulating film 62. The same will apply also to the further multi-layered wiring structure, since an etching selectivity will always be ensured between a silicon nitride film formed in the lower portion of an insulating film in which contact holes will be formed and a silicon oxide film thereunder, and thus the etching will never proceed so as to penetrate the lower insulating film.

Figure 6A:
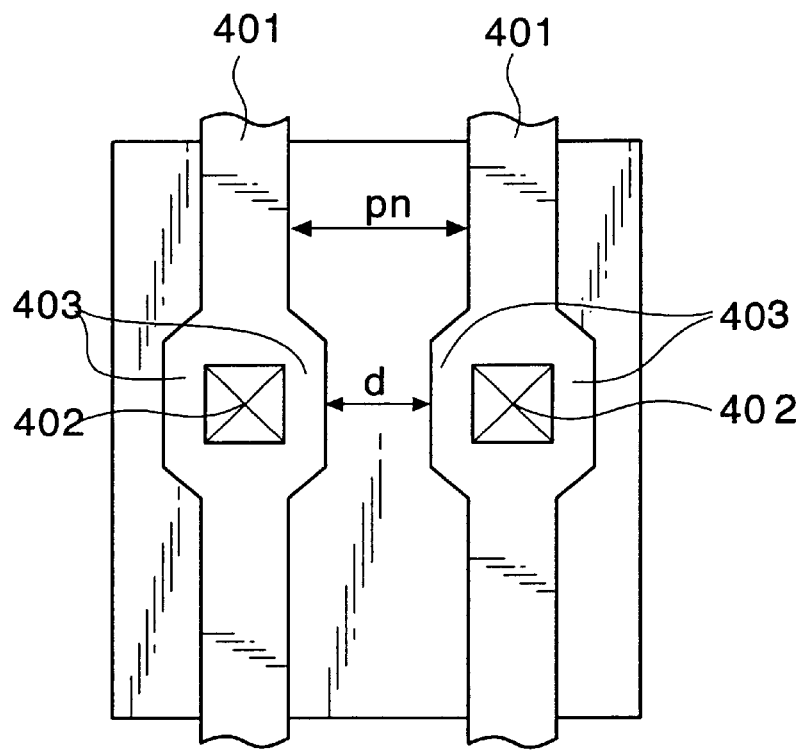
FIGS. 6A and 6B are plan views showing layouts of conventional wiring structures.
Figure 6B:
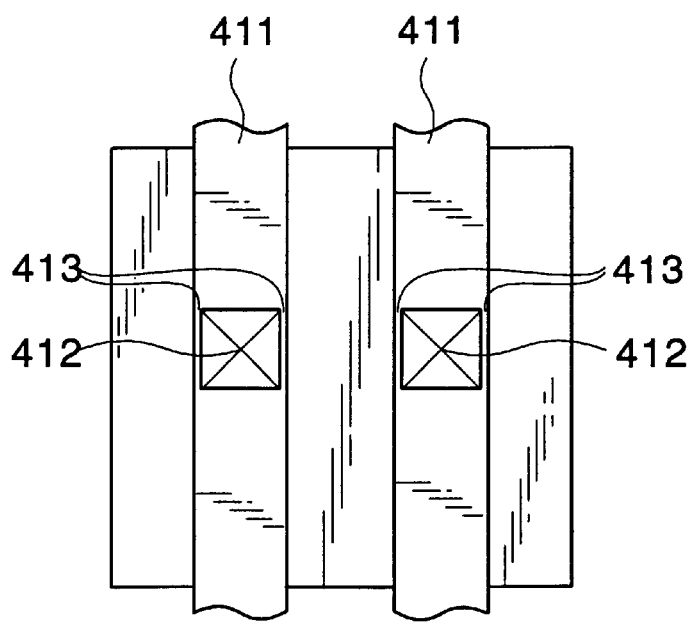
Figure 7A:
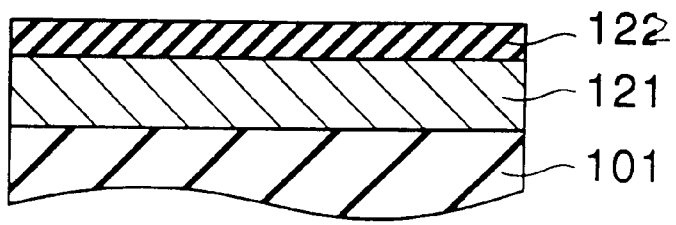
FIGS. 7A to 7H are process diagrams for explaining conventional method for fabricating multi-layered wiring structure.
Figure 7B:
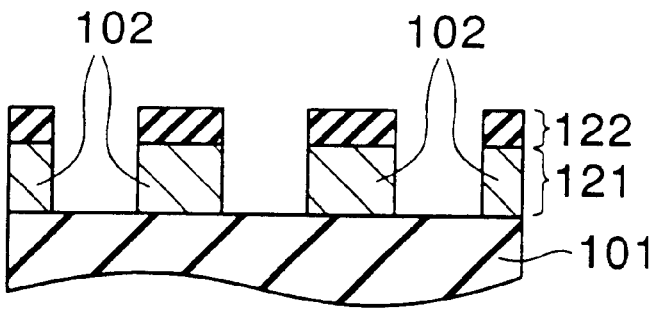
Figure 7C:
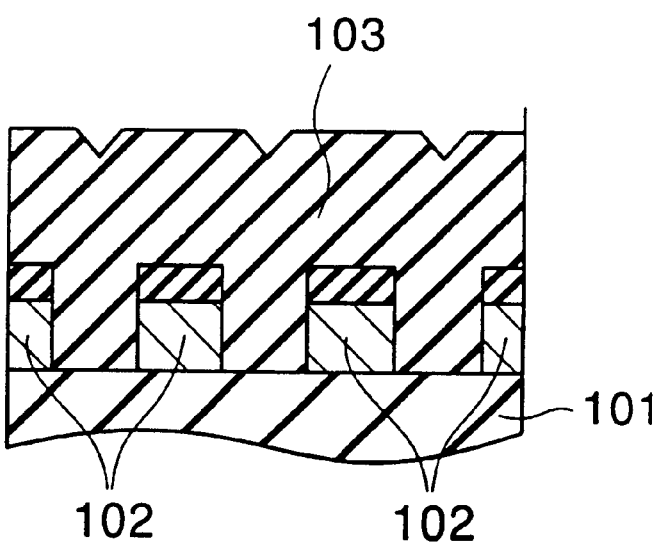
Figure 7D:
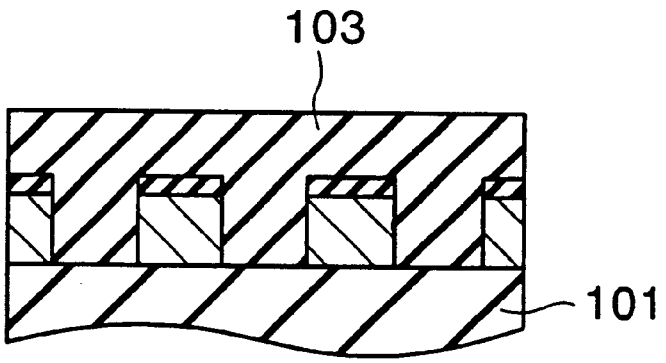
Figure 7E:
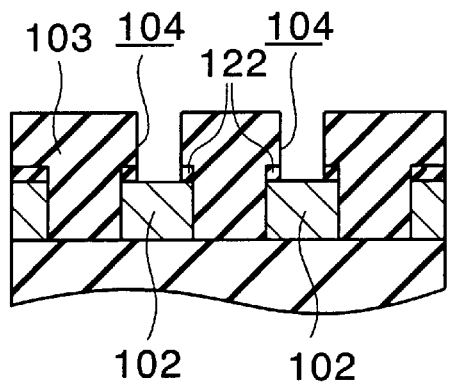
Figure 7F:
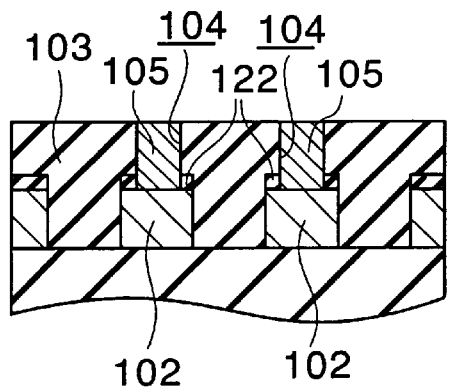
Figure 7G:
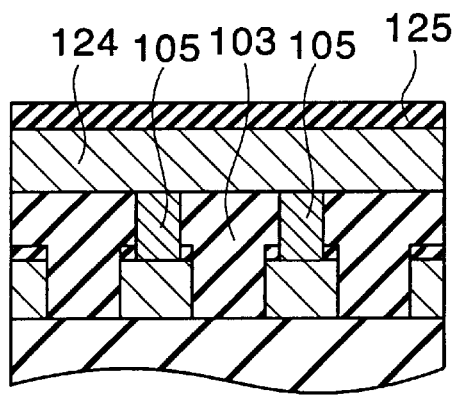
Figure 7H:
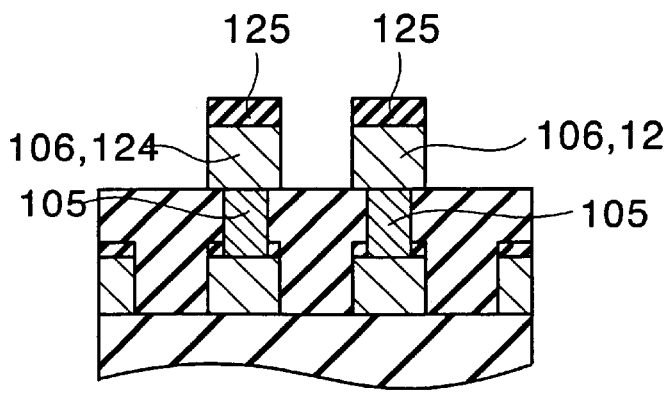
Figure 8:
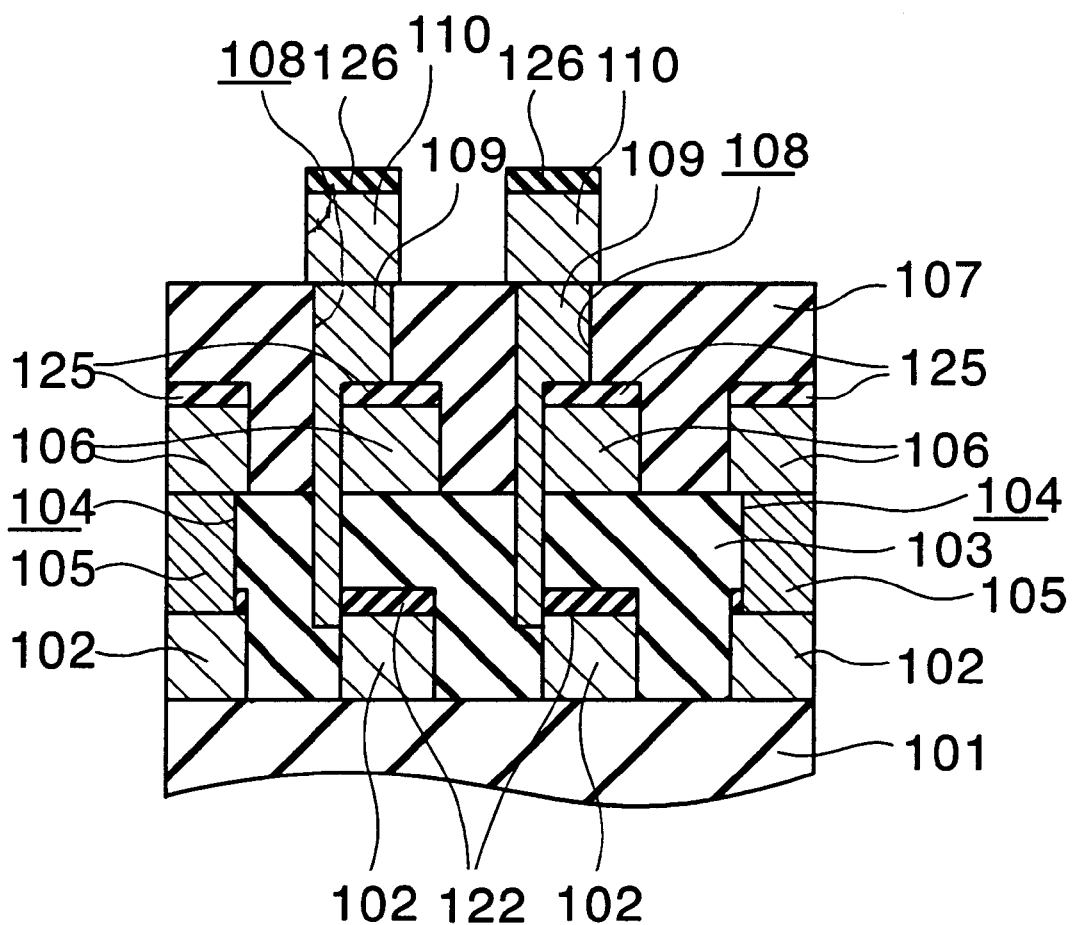
FIG. 8 is a schematic sectional view for explaining a conventional problem.

FIG. 1A
3 second insulating film
2 conductive body
1 first insulating film
FIG. 1B
6 recess

What is claimed is:

1. A method for fabricating semiconductor devices comprising the steps of:
    forming on a first insulating film, the first insulating film having a conductive body exposed thereon, a second insulating film so as to cover the conductive body, and
    forming by etching a recess to the second insulating film so as to reach the conductive body;
    wherein at least a lower portion of the second insulating film comprises a material exhibiting a faster etching rate over at least an upper portion of the first insulating film;
    wherein the material comprising the first insulating film is different from the material comprising the second insulating film, the material comprising the second insulating film further contains fluorine; and
    etching the recess in an environment containing a gaseous mixture of (a) $C_nF_{2n}$ or $C_nF_{3n}$ and (b) carbon monoxide and (c) argon, where $n \leq 1$.

2. A method for fabricating semiconductor devices as claimed in claim 1, wherein at least the upper portion of the first insulating film is formed with an organic insulating film, and at least the lower portion of the second insulating film is formed with a material exhibiting a faster etching rate over the organic insulating film.

3. A method for fabricating semiconductor devices as claimed in claim 2, wherein the lower portion of the second insulating film comprises an inorganic insulating film.

4. A method for fabricating semiconductor devices as claimed in claim 2, wherein the lower portion of the second insulating film comprises an organic insulating film.

5. A method for fabricating semiconductor devices as claimed in claim 1, wherein at least the upper portion of the first insulating film is formed with an inorganic insulating film, and at least the lower portion of the second insulating film is formed with a material exhibiting a faster etching rate over the inorganic insulating film.

6. A method for fabricating semiconductor devices as claimed in claim 5, wherein the lower portion of the second insulating film comprises an inorganic insulating film.

7. A method for fabricating semiconductor devices as claimed in claim 5, wherein the lower portion of the second insulating film comprises an organic insulating film.

8. A method for fabricating semiconductor devices as claimed in claim 1, wherein an etching selectivity of at least the lower portion of the second insulating film over at least the upper portion of the first insulating film is 3 or above.

9. A method for fabricating semiconductor devices as claimed in claim 8, wherein the etching selectivity is 5 or above.

10. A method for fabricating semiconductor devices as claimed in claim 8, wherein the recess comprises a contact hole, a groove or a groove having in the bottom thereof a contact hole.

11. A method for fabricating semiconductor devices comprising the steps of:
    forming on a first insulating film, the first insulating film having a conductive body exposed thereon, a second insulating film so as to cover the conductive body, and
    forming by etching a recess to the second insulating film so as to reach the conductive body;
    wherein at least a lower portion of the second insulating film comprises a material exhibiting a faster etching rate over at least an upper portion of the first insulating film;
    wherein the material comprising the first insulating film is different from the material comprising the second insulating film, the material comprising the second insulating film further contains a fluorine based compound;
    etching the recess in an environment containing a gaseous mixture of (a) $C_nF_{2n}$ or $C_nF_{3n}$ and (b) carbon monoxide and (c) argon, where $n \leq 1$;
    wherein the lower portion of the second insulating film comprises an organic insulating film; and
    wherein an etching selectivity of at least the lower portion of the second insulating film over at least the upper portion of the first insulating film is 3 or above.

12. The method of claim 11, wherein the etching selectivity is 5 or above.

13. The method of claim 11, wherein the recess comprises a contact hole, a groove or a groove having in the bottom thereof a contact hole.

14. The method of claim 13, wherein the first insulating film comprises either a fluorine-free organic film or a fluorine-containing inorganic film.

15. A method for fabricating semiconductor devices comprising the steps of forming on a first insulating film, the first insulating film having a conductive body exposed thereon, a second insulating film so as to cover the conductive body, and forming by etching a recess to the second insulating film so as to reach the conductive body;

wherein at least a lower portion of the second insulating film comprises a material exhibiting a faster etching rate over at least an upper portion of the first insulating film;

wherein the material comprising the first insulating film is different from the material comprising the second insulating film, the material comprising the second insulating film further contains a fluorine based compound;

etching the recess in an environment containing a gaseous mixture of (a) $C_nF_{2n}$ or $C_nF_{3n}$ and (b) carbon monoxide and (c) argon, where $n \leq 1$;

wherein the lower portion of the second insulating film comprises an organic insulating film; and wherein an etching selectivity of at least the lower portion of the second insulating film over at least the upper portion of the first insulating film is 5 or above.

16. The method of claim 15, wherein the recess comprises a contact hole, a groove or a groove having in the bottom thereof a contact hole.

17. The method of claim 15, wherein the first insulating film comprises either a fluorine-free organic film or a fluorine-containing inorganic film.

* * * * *